United States Patent
America et al.

(10) Patent No.: US 8,106,485 B2
(45) Date of Patent: Jan. 31, 2012

(54) CHEMICAL OXIDE REMOVAL OF PLASMA DAMAGED SICOH LOW K DIELECTRICS

(75) Inventors: William G. America, Kingston, NY (US); Steven H. Johnston, Poughkeepsie, NY (US); Brian W. Messenger, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 12/044,245

(22) Filed: Mar. 7, 2008

(65) Prior Publication Data

US 2008/0224273 A1 Sep. 18, 2008

Related U.S. Application Data

(62) Division of application No. 11/308,672, filed on Apr. 20, 2006, now Pat. No. 7,368,393.

(51) Int. Cl.
*H01L 29/06* (2006.01)
*H01L 21/44* (2006.01)

(52) U.S. Cl. ............ 257/622; 257/621; 257/E23.002; 257/E21.577; 257/E21.579; 438/675

(58) Field of Classification Search ............ 257/622, 257/E23.002, E21.577, E21.579; 438/675
See application file for complete search history.

(56) References Cited

U.S. PATENT DOCUMENTS

| | | | |
|---|---|---|---|
| 6,127,126 A * | 10/2000 | Vogelstein et al. | 435/6 |
| 6,127,276 A * | 10/2000 | Lin et al. | 438/713 |
| 6,271,094 B1 | 8/2001 | Boyd et al. | |
| 6,297,149 B1 * | 10/2001 | Stamper | 438/637 |
| 6,353,249 B1 | 3/2002 | Boyd et al. | |
| 6,436,808 B1 * | 8/2002 | Ngo et al. | 438/623 |
| 6,489,227 B1 * | 12/2002 | Hsieh et al. | 438/601 |
| 6,521,547 B1 * | 2/2003 | Chang et al. | 438/781 |
| 6,656,824 B1 | 12/2003 | Hanafi et al. | |
| 6,709,965 B1 * | 3/2004 | Chen et al. | 438/612 |
| 6,713,382 B1 * | 3/2004 | Pangrle et al. | 438/622 |
| 6,727,185 B1 | 4/2004 | Smith et al. | |
| 6,733,597 B2 | 5/2004 | Wu et al. | |
| 6,774,000 B2 | 8/2004 | Natzle et al. | |
| 6,972,258 B2 | 12/2005 | Chu et al. | |
| 7,179,757 B2 * | 2/2007 | RamachandraRao et al. | 438/780 |
| 7,368,393 B2 * | 5/2008 | America et al. | 438/706 |
| 2002/0151093 A1 * | 10/2002 | Woo et al. | 438/17 |
| 2004/0101667 A1 | 5/2004 | O'Loughlin et al. | |
| 2004/0198066 A1 * | 10/2004 | Verhaverbeke | 438/745 |
| 2004/0241981 A1 | 12/2004 | Doris et al. | |
| 2005/0118800 A1 | 6/2005 | Brakensiek et al. | |
| 2005/0142850 A1 * | 6/2005 | Cho | 438/624 |
| 2005/0230351 A1 * | 10/2005 | Tahara | 216/67 |
| 2007/0238298 A1 * | 10/2007 | Brown | 438/694 |

OTHER PUBLICATIONS

S. Wolf, Silicon Processing for the VLSI Era, vol. 4, Lattice Press (2002), pp. 650-651.
P.J. Matsuo, Journal of Vacuum Science & Technology, vol. A 15(4), Jul./Aug. 1997, pp. 1801-1813.

* cited by examiner

*Primary Examiner* — Zandra Smith
*Assistant Examiner* — Jeremy Joy
(74) *Attorney, Agent, or Firm* — Wenjie Li; Roberts Mlotkowski Safran & Cole, P.C.

(57) ABSTRACT

A structure and method for removing damages of a dual damascene structure after plasma etching. The method includes the use of sublimation processes to deposit reactive material onto the damaged regions and conditions to achieve a controlled removal of the damaged region. Furthermore a semiconductor structure includes a dual damascene structure that has been treated by the method.

16 Claims, 5 Drawing Sheets

CHEMICAL OXIDE REMOVAL OF PLASMA DAMAGED SICOH LOW K DIELECTRICS

CROSS REFERENCE TO RELATED APPLICATIONS

This application is a divisional of U.S. patent application Ser. No. 11/308,672, filed Apr. 20, 2006 now U.S. Pat. No. 7,368,393, the disclosure of which is expressly incorporated by reference herein in its entirety.

BACKGROUND OF INVENTION

1. Field of the Invention

The invention is related to a method of removal of damaged interlevel dielectric or low-k material after trench etching prior to the metallization and during the dual damascene process.

2. Background Description

Damascene in semiconductor manufacture is the process of interconnecting metal with the semiconductor device. These metal connections have to be established in a precise manner and interconnecting wires have to be isolated to avoid undesired interaction between the metal wires with other parts of the device.

In the early era of semiconductor manufacture, silica or silicate glasses were used as an insulator. As semiconductor devices became faster and thus smaller, metal connections on a device grew closer requiring that the insulating material (silicates) become thinner. However, build up of charges in the thin layers of insulating material can result in an undesired "crosstalk" between metal connectors. This charge build-up and crosstalk could be avoided by the use of insulating material with a dielectric constant less than 3.9, which are referred to as low k dielectrics.

Chemically, silicates or silicon dioxide are structures where each silicon atom is surrounded by four oxygen atoms. Thereby, the negative charges are predominantly located at the oxygen atoms and positive charges are located at the silicon atom. These charge separations contribute to the relative high dielectric constant of silica. A removal of oxygen in the silicate frame and replacement with groups such as alkyl radicals that do not induce a charge separation between the silicon atom and the alkyl moiety have the result of a lower dielectric constant. Another positive side effect is that these organic silica structures, so called siloxanes are more porous, i.e., less dense than its homologous silica and this contributes to an even lesser dielectric constant. Therefore, some insulation materials used in damascene are low-k Siloxanes, also referred to as SiLK or SiCOH materials.

Dual Damascence is a modified version of the damascene process. Here, prior to the metallization, the semiconductor structure is coated with SiCOH material. Then trenches for the metal connection are etched into the structure using commonly adapted etching methods, such as plasma etching. The etching process has a tendency to damage the SiCOH material resulting in the introduction of oxygen into the SiCOH material, which has the effect of elevating the dielectric constant. The chemical reaction can be described as:

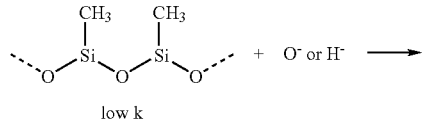

low k

+ O⁻ or H⁻ ⟶

-continued

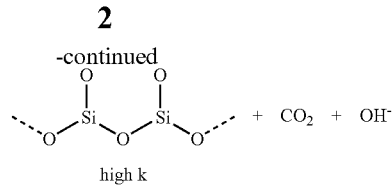

high k

+ $CO_2$ + $OH^-$

In the past, the damage on the SiCOH material was removed using an aqueous dilution of hydrofluoric acid. However, dilute hydrofluoric acid also etches the low-k material, thus resulting in a widening of the trench. The aqueous solution also attacks other silicon containing parts of the device, e.g. masking layers such as TEOS oxides. Additionally, the penetration of the porous SiCOH material by the aqueous hydrofluoric acid solution may be intensified by capillary forces, thus resulting in a internal corrosion of the low-k material. Furthermore, the use of aqueous solutions may impede the homogenous removal of damage across the silicon wafer, since it is difficult to apply the solution uniformly across the surface. Additionally, in a solution based removal, the surface tension of liquid droplets distributed onto the wafer may result in a non-homogenous trim of the sidewalls of the newly formed trenches.

Accordingly, there exists a need in the art to overcome the deficiencies and limitations described hereinabove.

SUMMARY OF THE INVENTION

In a first aspect of the invention, a method for removing a plasma induced damaged layer of low-k dielectric material includes the deposition of a mixture that is generated from gaseous hydrofluoric acid and ammonia gas. The deposited mixture reacts with a surface comprising the damage and generates volatile reaction products. The method further includes the removal of these reaction products.

In a second aspect of the invention, a method for trimming a dual damascene structure of a semiconductor includes the deposition of a material generated from a dilute mixture of gaseous hydrofluoric acid and ammonia gas in a non-reactive diluent gas, followed by heating the structure. The method further includes the flushing of the dual damascene structure with a non-reactive flush gas.

In a third aspect, the invention includes a semiconductor device having a plasma etched dual damascene structure with an interlevel dielectric film (ILD) whereby damage to a surface of the plasma etched dual damascene structure is removed by depositing a controlled amount of gaseous hydrofluoric acid and ammonia gas onto the surface of the dual damascene structure.

DETAILED DESCRIPTION OF EMBODIMENTS OF THE INVENTION

The invention relates to a method designed to remove damage that results from etching processes during the formation of a structure, and more particularly to the removal of damage that occurs to the interlevel dielectric film (ILD) induced during plasma etching processes. In embodiments, the method includes the deposition of a material generated from gaseous hydrofluoric acid and ammonia gas onto the surface of the plasma etched dual damascene structures prior to metallization. In embodiments, the gaseous mixture of hydrofluoric acid and ammonia gas is diluted with a non-reactive diluent gas, such as noble gases (helium, neon, argon, xenon) or nitrogen.

Figure 1A:
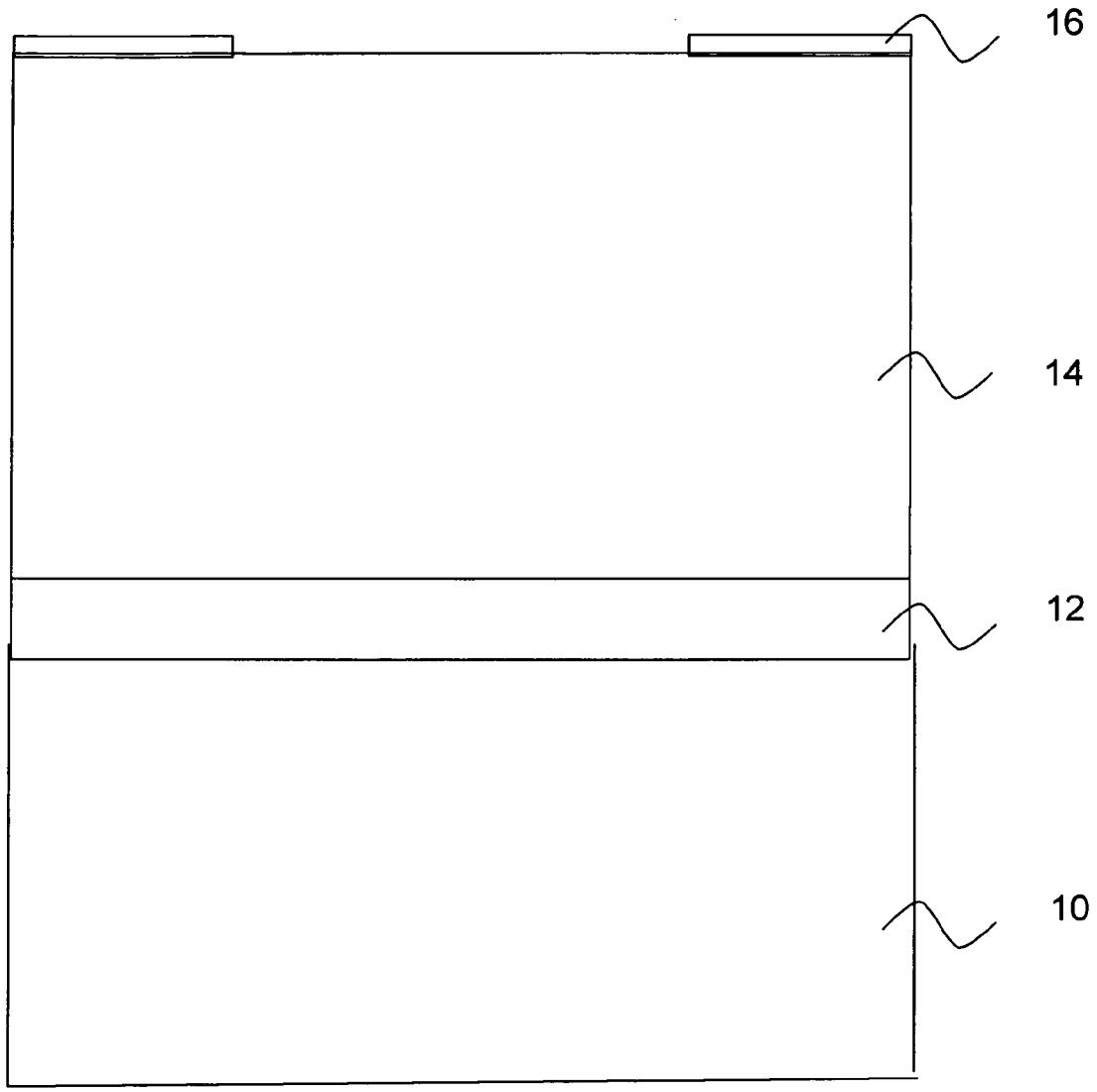
FIGS. 1a-1d illustrate a method for removing damage from a surface of a sidewall after a plasma etching process in accordance with the invention.

FIG. 1a represents a dual damascene structure prior to plasma etching, such as RIE. In general, the structure includes a wafer represented by reference numeral 10. A barrier cap or layer 12 comprising known material such as silicon nitride ($Si_3N_4$) is deposited on the silicon wafer 10 to any desired thickness. An interlevel dielectric film (ILD) 14 is formed on the barrier layer 12. In embodiments, the ILD material may comprise silicon containing oxide material with organic groups that result in an insulating material with a decreased dielectric constant (low-k or SiCOH material). The ILD, in embodiments, comprises of material with a dielectric constant of 3.9 or less, and is preferably organic siloxanes.

A photoresist material 16 is formed and patterned on the layer 14, which protects the underlying material during the plasma etching process. Any commonly known method for applying the photoresist can be used with the invention. As should be understood, the etched trench can be about 100 nm, but smaller and larger sizes are within the scope of the invention.

Figure 1B:
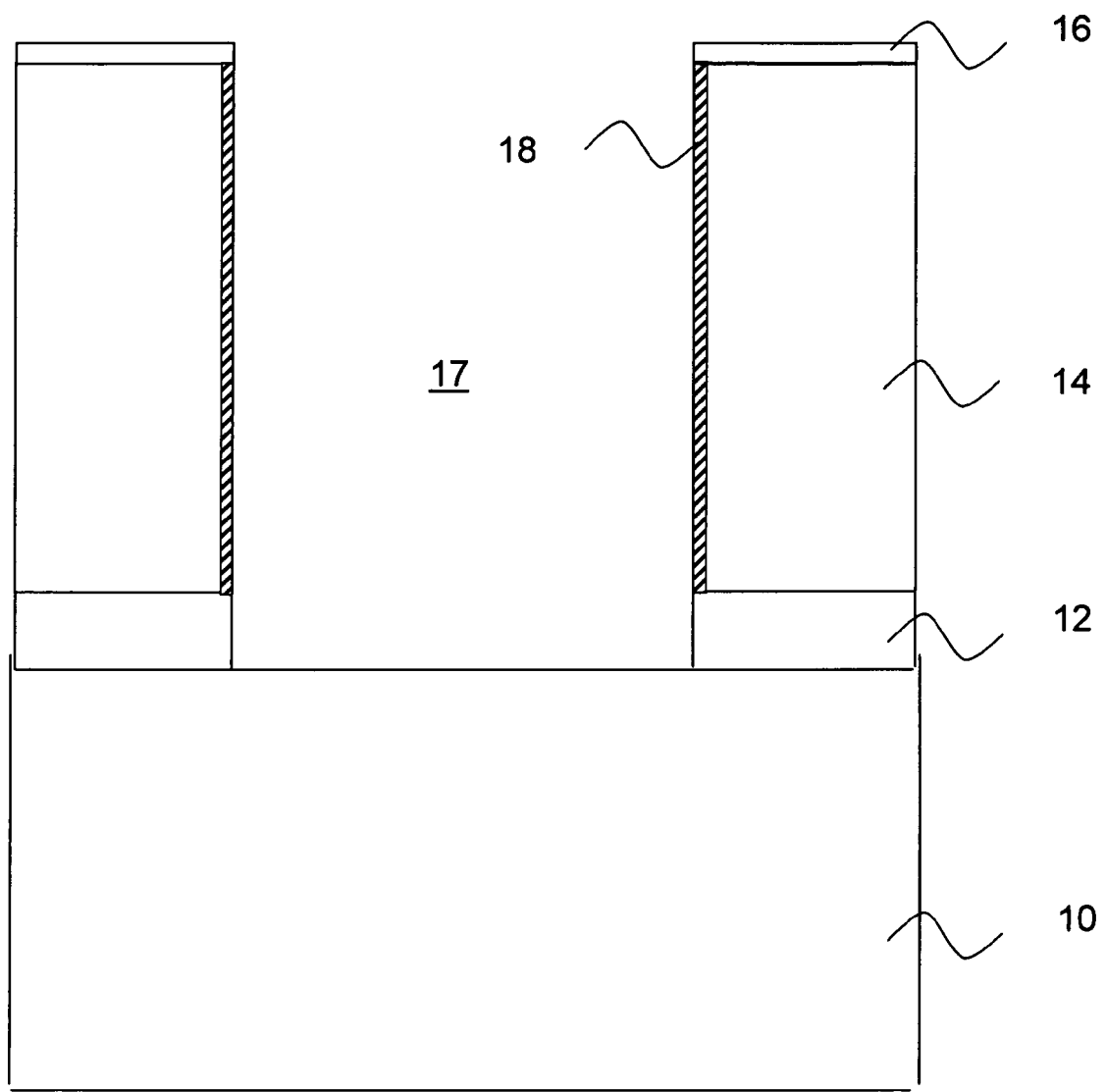

FIG. 1b depicts the structure after the plasma etching process such as RIE. In this representation, a trench or via 17 is etched into the structure, preferably to the silicon wafer 10. During the plasma etching process, damage occurs to the sidewalls of the trench 17, which comprises low-k SiCOH material. This plasma-induced damage is represented by the hatched elements at reference numeral 18. Depending on the nature of the low-k SICOH material, damage usually reaches between 1 to 25 nm into the low-k SiCOH material.

Figure 1C:
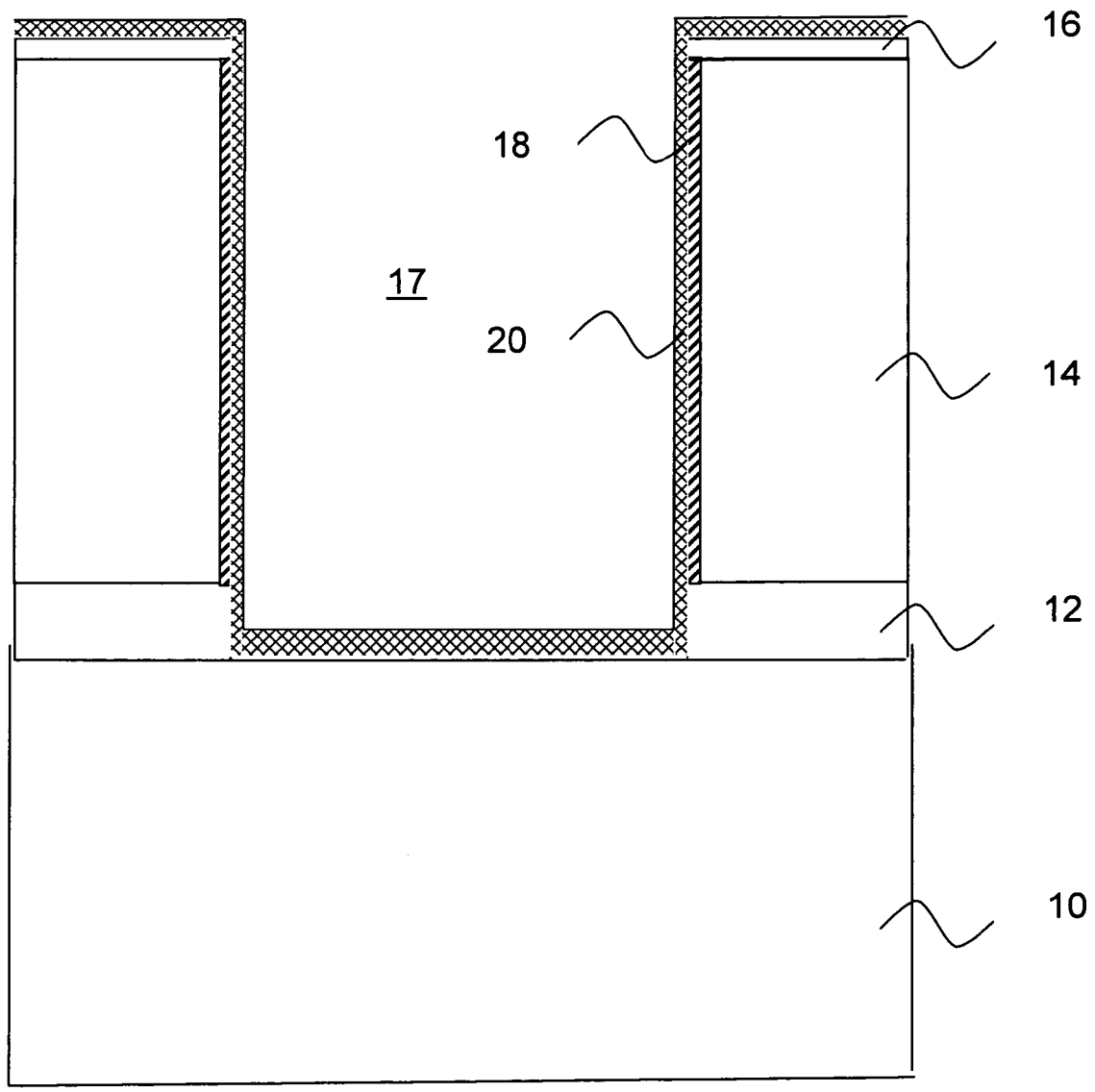

FIG. 1c depicts the deposition of sublimed mixtures of gaseous hydrofluoric acid and ammonia gas onto the dual damascene structure after plasma etching of the trench or via 17. The sublimed material is depicted as reference numeral 20. In embodiments, the sublimation (formation of a precipitate from a gas) is carried out in a sublimation chamber and occurs by controlling deposition of both hydrofluoric acid and ammonia in the gas phase.

In embodiments, the material is deposited from a mixture of hydrofluoric acid and ammonia gas present in a stochiometric ratio from 4:1 to 1:4, preferably 2:1 ($HF:NH_3$); although, ratios outside these ranges are contemplated. In further embodiments, a combined partial pressure of the gaseous hydrofluoric acid, the ammonia gas and a non-reactive diluent gas is between 1 and 20 millitorr, preferably 10 to 15 millitorr, with other ranges contemplated by the invention. In one preferred embodiment, a 10 millitorr pressure can be achieved by a combination of approximately 5 millitorr hydrofluoric acid, 2.5 millitorr ammonia and 2.5 millitorr argon. In embodiments, the reduced pressure atmosphere eliminates surface tension of the HF as well as causes a retarded sublimation process to gain control of the amount of reactants being sublimed onto the surface.

The method further comprises providing a flow of non-reactive diluent gas into the system, with flow ranges up to about 400 $cm^3$/min, and preferably between 0 and 250 $cm^3$/min. (Other flow ranges are also contemplated by the invention.) It should be recognized that the flow of the non-reactive diluent gas increases the dilution of the gaseous mixture of the two reactive gases. Also, the dilution of the reactive gases results in a retardation of the deposition of the reactants, thereby permitting less material to sublime onto the surface thus allowing control of the amount of sublimed material and increased control of the removal of damaged material.

In an exemplary embodiment, as the deposited material forms on the device, a flow of argon enters the chamber at a rate up to about 250 $cm^3$/min. This contributes to the controllability of the method due to a dilution of the reactive gases, ammonia and hydrofluoric acid. This may result in a slowdown or even cessation of the sublimation process.

In the embodiments of the invention, the hydrofluoric acid reacts with the ILD 14 and the barrier layer 12 forming volatile reaction products, such as fluorosilanes and ammonium hydroxide. A completion of the reaction as well as transfer of the reaction products and the unreacted sublimed material into the gas phase can be achieved by heating the structure to a critical temperature, between ambient and 200° C., and preferably 150° C. The formed gaseous phase of the volatile reaction products and unreacted hydrofluoric acid and ammonia is carried away from the chamber by either applying a vacuum or by flushing the system with a non-reactive flush gas such as, for example, argon or nitrogen. Flushing with a non-reactive flush gas may occur between 10 millitorr and atmospheric pressure, preferably 675 millitorr. In embodiments, a vacuum step can follow the flushing of the structure.

As material 20 sublimes onto the structure, a chemical reaction between the hydrofluoric acid and the damaged sidewall of SiCOH as well as the $Si_3N_4$ material occurs. Furthermore, the reactive sublimed material does not affect the elemental silicon of the wafer as well as the photoresist. In further embodiments, the method also includes that sublimation is carried out in the sublimation chamber but the reaction can be delayed or carried out in another chamber.

As should be understood, in embodiments, implementation of the invention (e.g., ratio of reactive gas mixtures, diluent gases, pressure, flow, temperatures, and removal of reaction products) can be applied in a method for trimming a dual damascene structure after plasma etching. That is, by using the method of the invention, a trench or via, with damaged sidewalls, can be trimmed to clean the damage from the walls. In the processes described herein, the trimming can be controlled precisely by the use of different pressures and temperatures; that is, for example, an increased etch rate may be achieved by increasing the pressure conditions. Likewise, an increased etch rate may be achieved by decreasing the diluent gas, for example, argon.

Figure 1D:
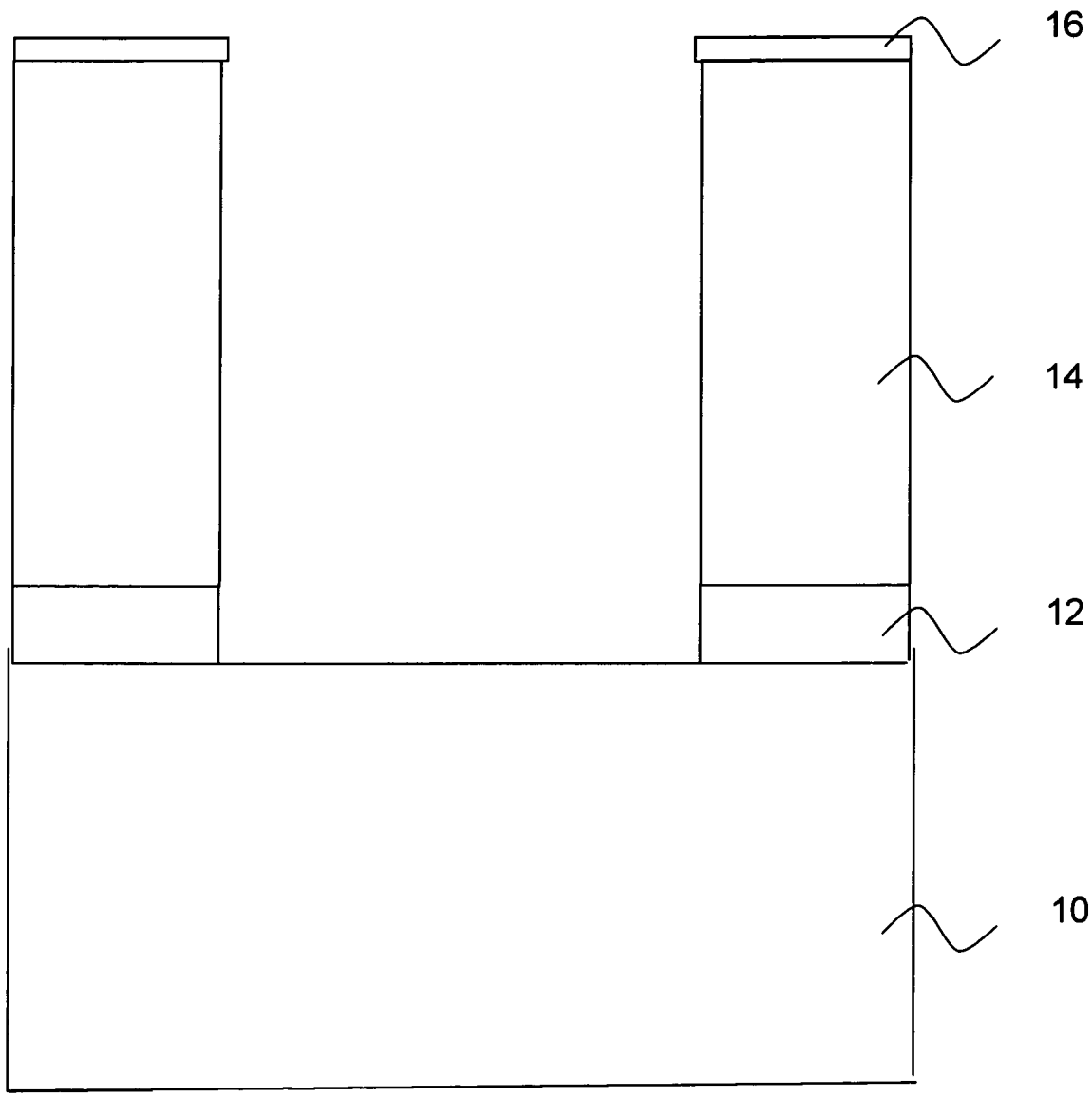

FIG. 1d depicts the structure after the plasma induced damage has been removed. Previously undesired damage areas 18 are now removed and the low-k SiCOH material 14 comprises a uniform sidewall.

Figure 2:
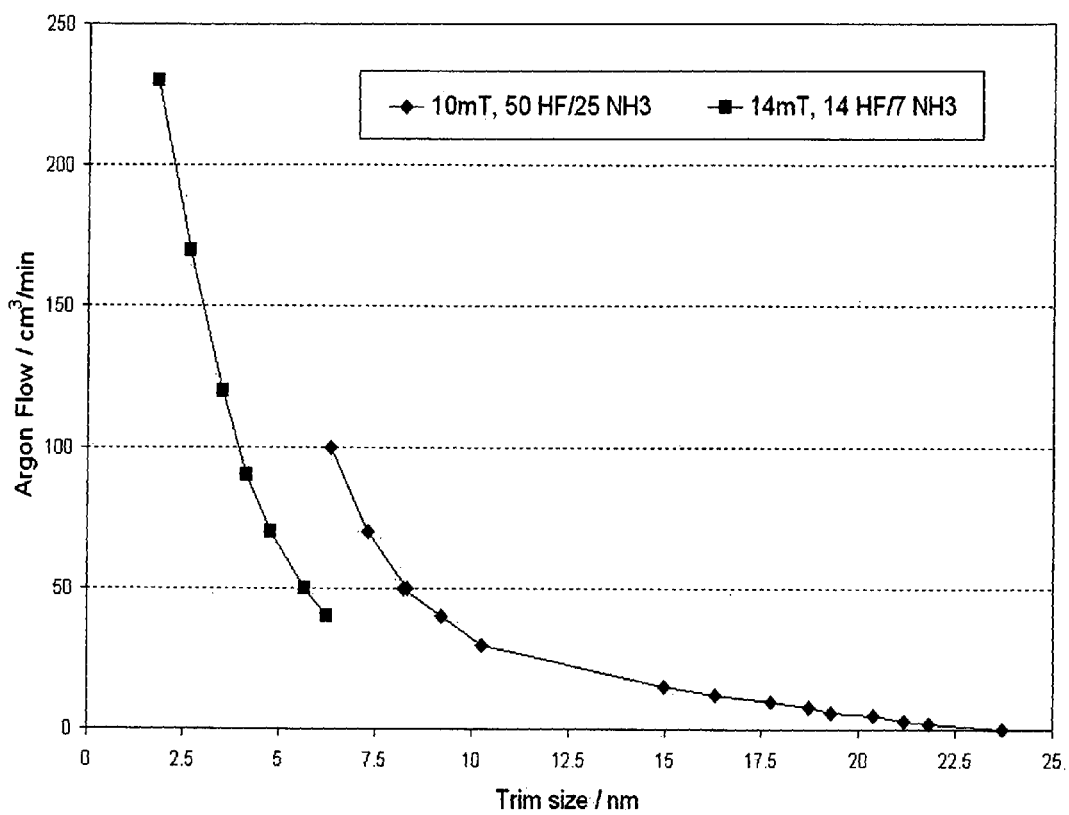
FIG. 2 depicts a graph showing variables for trimming damaged surface material in accordance with the invention.

FIG. 2 depicts a graph showing variables for trimming damaged surface material in accordance with the invention. Generally, the graph shows argon flow vs. trim size. In this graph, three conditions and accompanying results are shown: 10 mT, 50 HF/25 $NH_3$, 14 mT, 14 HF/7 $NH_3$, and a series three test. A non-lineal trendline connects the rhombuses to determine which argon flow would result in a desired trim size. In this representation, these conditions are applicable for desired trim sizes between approximately 6 and 25 nm, 10 mT, 50 HF/25 $NH_3$.

In this representation, the combined reduced pressure is 10 millitorr, partially distributed to 50% (5 millitorr) hydrofluoric acid (HF), 25% (2.5 millitorr) ammonia ($NH_3$), with the remainder being argon (25%, 2.5 millitorr). Measure points depicted as rhombuses show the amount trimmed (x-axis) when these conditions are applied at various argon flows followed by heating (to 150° C.) and flushing. For example, if these conditions (10 millitorr, 50 HF/25 $NH_3$) are applied for two minutes at an argon flow of, for example, 25 cm$^3$/min., the size trimmed from the sidewalls of the low-k material is about 10 nm, 14 mT, 14 HF/7 NH$_3$.

In this representation, the reduced pressure ranges at around 14 millitorr combined from 14% (~2.2 millitorr) hydrofluoric acid gas 7% (~1.1 millitorr NH$_3$) and the remainder argon. Once generated in the reaction chamber, a trim size between 2 and 6 nm can be achieved by adjusting the flow of argon between about 40 cm$^3$/min and 225 cm$^3$/min.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A semiconductor device comprising:
 a plasma etched damascene structure comprising a trench having sidewalls formed in an interlevel dielectric film;
 a barrier layer comprising Si$_3$N$_4$ formed on a silicon wafer; and
 a photoresist layer formed on the interlevel dielectric film;
 wherein the sidewalls are devoid of plasma-induced damage,
 the interlevel dielectric film is formed on the barrier layer, and
 the sidewalls are recessed from the photoresist by an amount equal to a trimming dimension associated with a removed damaged portion, whereby damage to the sidewalls of the plasma etched damascene structure is removed by:
  depositing a controlled amount of gaseous hydrofluoric acid and ammonia gas onto the sidewalls of the dual damascene structure;
  forming volatile reaction products from a chemical reaction between the plasma induced damages and the deposited mixture of ammonia gas and gaseous hydrofluoric acid; and
  removing the volatile reaction products.

2. The semiconductor device according to claim 1, wherein the interlevel dielectric film comprises low k material having a dielectric constant of 3.9 or less.

3. The semiconductor device according to claim 1, wherein the damage is removed by trimming the sidewalls between 1 and 25 nm.

4. The semiconductor device of claim 1, wherein the interlevel dielectric film comprises organic siloxanes.

5. The semiconductor device of claim 1, wherein the volatile reaction products are removed with a vacuum.

6. The semiconductor device of claim 1, wherein the volatile reaction products are removed with a non-reactive flushing gas.

7. The semiconductor device of claim 1, wherein the volatile reaction products are removed with a vacuum or a non-reactive flushing gas.

8. The semiconductor device of claim 1, wherein the trench extends through the barrier layer to the silicon wafer.

9. The semiconductor device according to claim 1, wherein the sidewalls are recessed from the photoresist by approximately 1 to 25 nm.

10. A semiconductor device comprising:
 a plasma etched dual damascene structure comprising a trench having sidewalls formed in an interlevel dielectric film; and
 a photoresist layer formed on the interlevel dielectric film;
 wherein the sidewalls are devoid of plasma-induced damage, and
 the sidewalls are recessed from the photoresist, whereby damage to the sidewalls of the plasma etched dual damascene structure is removed by:
  depositing a controlled amount of gaseous hydrofluoric acid and ammonia gas onto the sidewalls of the dual damascene structure;
  forming volatile reaction products from a chemical reaction between the plasma induced damages and the deposited mixture of ammonia gas and gaseous hydrofluoric acid; and
  removing the volatile reaction products,
 wherein the recessed sidewalls result in a portion of the photoresist forming an overhang; and
 the recessed sidewalls are recessed from the photoresist by an amount equal to a trimming dimension associated with a removed damaged portion.

11. The semiconductor device according to claim 1, wherein sidewalls of the barrier layer are recessed from the photoresist.

12. The semiconductor device according to claim 11, wherein both the sidewalls formed in the interlevel dielectric film and the sidewalls of the barrier layer are recessed from the photoresist by approximately 1 to 25 nm.

13. The semiconductor device according to claim 11, wherein a portion of the photoresist overhangs both the sidewalls formed in the interlevel dielectric film and the sidewalls of the barrier layer.

14. The semiconductor device according to claim 1, wherein:
 the interlevel dielectric film is directly on the barrier layer;
 the trench extends through the barrier layer to the silicon wafer;
 the sidewalls of the barrier layer are recessed from the photoresist by an amount equal to the trimming dimension associated with the removed damaged portion;
 the sidewalls formed in the interlevel dielectric film and the sidewalls of the barrier layer are aligned; and
 the interlevel dielectric film comprises organic siloxanes.

15. A semiconductor device comprising:
 a plasma etched damascene structure comprising a trench having sidewalls formed in an interlevel dielectric film;
 a photoresist layer formed on the interlevel dielectric film; and
 a barrier layer on a silicon wafer,
 wherein the sidewalls are devoid of plasma-induced damage,
 the sidewalls are recessed from the photoresist,
 the interlevel dielectric film is on and contacting the barrier layer;
 the trench extends through the barrier layer to the silicon wafer;
 both the sidewalls formed in the interlevel dielectric film and sidewalls of the barrier layer are recessed from the photoresist by an amount equal to a trimming dimension associated with a removed damaged portion;
 the sidewalls formed in the interlevel dielectric film and the sidewalls of the barrier layer are aligned;
 the interlevel dielectric film comprises organic siloxanes;
 the barrier layer comprises nitride; and
 damage to the sidewalls of the plasma etched damascene structure is removed by:
  depositing a controlled amount of gaseous hydrofluoric acid and ammonia gas onto the sidewalls of the dual damascene structure;

forming volatile reaction products from a chemical reaction between the plasma induced damages and the deposited mixture of ammonia gas and gaseous hydrofluoric acid; and removing the volatile reaction products.

16. A semiconductor device comprising:

a damascene structure comprising a trench having sidewalls formed in an interlevel dielectric film;

a barrier layer comprising nitride on a silicon wafer; and a photoresist layer on the interlevel dielectric film;

wherein the sidewalls are devoid of plasma-induced damage, the interlevel dielectric film is on the barrier layer, and the sidewalls are recessed from the photoresist by an amount equal to a trimming dimension associated with a removed damaged portion.

* * * * *